United States Patent
Lee

(10) Patent No.: US 8,129,207 B2
(45) Date of Patent: Mar. 6, 2012

(54) LIGHT EMITTING DIODE HAVING A THERMAL CONDUCTIVE SUBSTRATE AND METHOD OF FABRICATING THE SAME

(75) Inventor: Jae-Ho Lee, Yongin-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/235,053

(22) Filed: Sep. 16, 2011

(65) Prior Publication Data

US 2012/0003766 A1  Jan. 5, 2012

Related U.S. Application Data

(62) Division of application No. 11/994,306, filed as application No. PCT/KR2006/002146 on Jun. 5, 2006, now Pat. No. 8,039,846.

(30) Foreign Application Priority Data

Jun. 29, 2005 (KR) .................. 10-2005-0057327

(51) Int. Cl.
*H01L 21/50* (2006.01)
*H01L 21/00* (2006.01)

(52) U.S. Cl. ............... 438/33; 438/22; 438/26; 438/27; 438/42; 438/80; 438/82; 438/93; 257/79; 257/89; 257/91; 257/98; 257/99; 257/E21.499; 257/E21.599; 257/E27.12; 257/E27.121; 257/E33.005; 257/E33.056; 257/E33.066

(58) Field of Classification Search .............. 438/22, 438/26, 27, 33, 42, 80, 82, 93; 257/79, 89, 257/91, 98, 99, E21.499, E21.599, E27.12, 257/E27.121, E33.005, E33.056, E33.066
See application file for complete search history.

(56) References Cited

U.S. PATENT DOCUMENTS

| 6,365,429 | B1 | 4/2002 | Kneissl et al. | |
| 7,041,529 | B2 * | 5/2006 | Yamada et al. | 438/93 |
| 7,208,336 | B2 * | 4/2007 | Wu et al. | 438/35 |
| 8,039,864 | B2 * | 10/2011 | Takao et al. | 257/99 |

(Continued)

FOREIGN PATENT DOCUMENTS

EP   1653523   5/2006

(Continued)

OTHER PUBLICATIONS

Written Opinion of PCT/KR2006/002146 dated on Sep. 14, 2006.

(Continued)

*Primary Examiner* — Dao H Nguyen
(74) *Attorney, Agent, or Firm* — H.C. Park & Associates, PLC

(57) ABSTRACT

Disclosed are a light emitting diode having a thermal conductive substrate and a method of fabricating the same. The light emitting diode includes a thermal conductive insulating substrate. A plurality of metal patterns are spaced apart from one another on the insulating substrate, and light emitting cells are located in regions on the respective metal patterns. Each of the light emitting cells includes a P-type semiconductor layer, an active layer and an N-type semiconductor layer. Meanwhile, metal wires electrically connect upper surfaces of the light emitting cells to adjacent metal patterns. Accordingly, since the light emitting cells are operated on the thermal conductive substrate, a heat dissipation property of the light emitting diode can be improved.

6 Claims, 2 Drawing Sheets

U.S. PATENT DOCUMENTS

| | | |
|---|---|---|
| 2003/0010989 A1 | 1/2003 | Yukimoto |
| 2003/0189216 A1 | 10/2003 | Kamatani et al. |
| 2004/0104393 A1 | 6/2004 | Liu et al. |
| 2004/0124428 A1 | 7/2004 | Lin et al. |
| 2004/0135166 A1 | 7/2004 | Yamada et al. |
| 2005/0023550 A1 | 2/2005 | Eliashevich et al. |
| 2005/0062049 A1 | 3/2005 | Lin et al. |
| 2005/0242361 A1 | 11/2005 | Bessho et al. |
| 2005/0253151 A1 | 11/2005 | Sakai et al. |
| 2006/0169993 A1 | 8/2006 | Fan et al. |
| 2007/0121690 A1 | 5/2007 | Fujii et al. |
| 2011/0159771 A1* | 6/2011 | Yamazaki et al. ............... 445/24 |
| 2011/0215364 A1* | 9/2011 | Sugawara et al. ................ 257/99 |
| 2011/0229997 A1* | 9/2011 | Akaike et al. .................... 438/33 |

FOREIGN PATENT DOCUMENTS

| | | |
|---|---|---|
| GB | 2311413 | 9/1997 |
| JP | 54-056796 | 5/1979 |
| JP | 2000-228537 | 8/2000 |
| JP | 16-006582 | 1/2004 |
| JP | 2005-051173 | 2/2005 |
| JP | 2005-064113 | 3/2005 |
| KR | 10-2002-0036463 | 5/2002 |
| KR | 10-2004-0010168 | 1/2004 |
| KR | 10-2005-0023184 | 3/2005 |
| WO | 97-37385 | 10/1997 |
| WO | 2004/023568 | 3/2004 |
| WO | 2004-023568 | 3/2004 |
| WO | 2005/043631 | 5/2005 |

OTHER PUBLICATIONS

International Search Report of PCT/KR2006/002146 dated on Sep. 14, 2006.

Non-Final Office Action of U.S. Appl. No. 11/994,306 issued on Nov. 10, 2010.

Final Office Action of U.S. Appl. No. 11/994,306 issued on Mar. 9, 2011.

Notice of Allowance of U.S. Appl. No. 11/994,306 issued on Jun. 29, 2011.

T. Fujii, et al., "Increase in the extraction efficiency of GaN-based light-emitting diodes via surface roughening", Applied Physics Letters, vol. 84, No. 6, Feb. 9, 2004, pp. 855-857.

European Search Report of European Patent Application No. 06-768-755.8-1235 dated Dec. 20, 2010, corresponding to U.S. Appl. No. 11/994,306.

* cited by examiner

[Fig. 1]
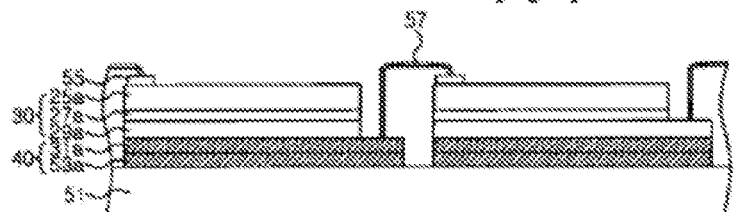
[Fig. 2]
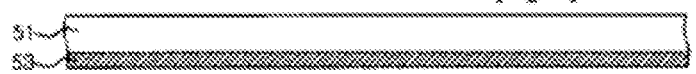
[Fig. 3]
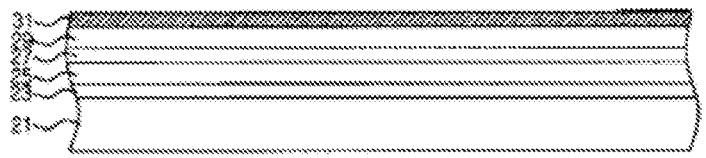
[Fig. 4]
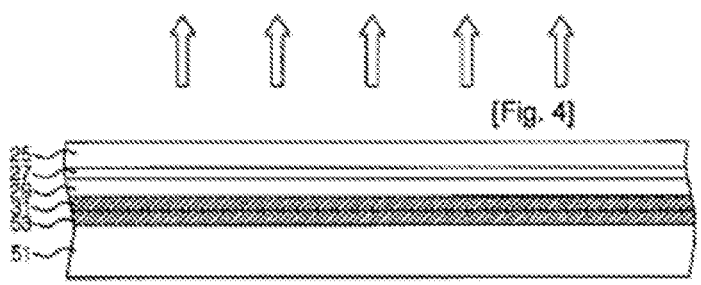
[Fig. 5]
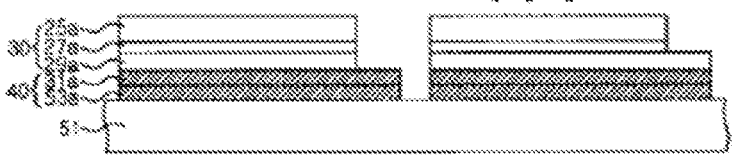
[Fig. 6]
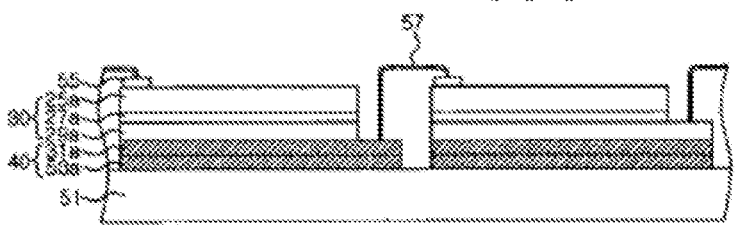

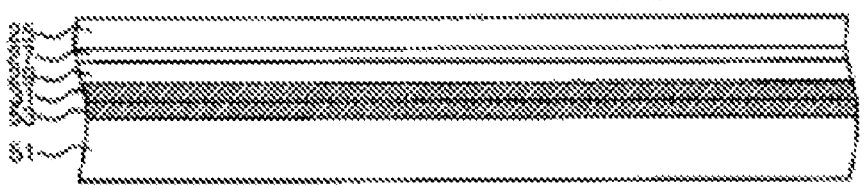
[Fig. 7]
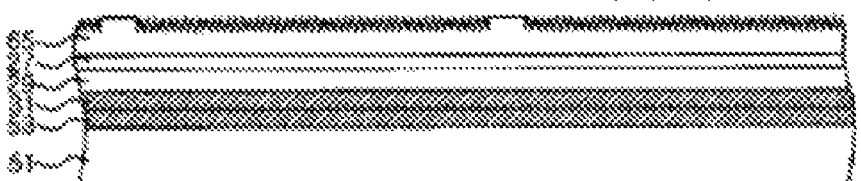
[Fig. 8]
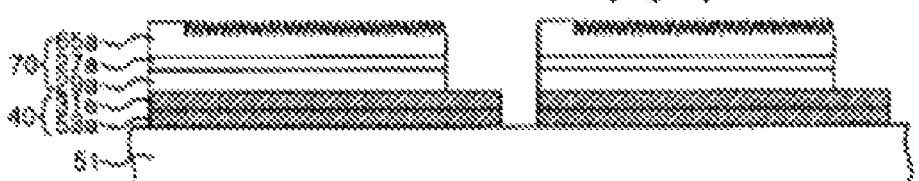
[Fig. 9]
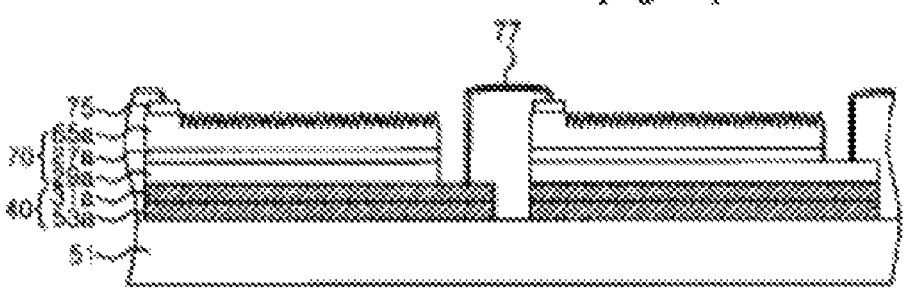
[Fig. 10]

LIGHT EMITTING DIODE HAVING A THERMAL CONDUCTIVE SUBSTRATE AND METHOD OF FABRICATING THE SAME

CROSS-REFERENCE TO RELATED APPLICATION

This application is a divisional of U.S. patent application Ser. No. 11/994,306, filed on Jan. 25, 2008, which is the national stage Entry of International Application No. PCT/KR2006/002146, filed Jun. 5, 2006, and claims priority from Korean Patent Application No. 10-2005-0057327, filed Jun. 29, 2005, which are incorporated herein by reference for all purposes as if fully set forth herein.

BACKGROUND OF THE INVENTION

1. Field of the Invention

The present invention relates to a light emitting diode and a method of fabricating the same, and more particularly, to a light emitting diode having a thermal conductive is substrate and a method of fabricating the same.

2. Discussion of the Background

A light emitting diode (LED) is an electroluminescent device having a structure in which an N-type semiconductor and a P-type semiconductor are joined together, and emits light through recombination of electrons and holes. Such an LED has been widely used for a display and a backlight. Further, since the LED has less electric power consumption and a long life span as compared with conventional electric bulbs or fluorescent lamps, its application area has been expanded to the use thereof for general illumination while substituting for conventional incandescent bulbs and fluorescent lamps.

The LED repeats on/off in accordance with the direction of a current under an AC power source. Thus, if the LED is used while being connected directly to the AC power source, there is a problem in that it does not continuously emit light and is easily broken by means of a reverse current.

To solve such a problem of the LED, an LED that can be used while being connected directly to a high voltage AC power source is proposed in International Publication No. WO 2004/023568A1 entitled "LIGHT-EMITTING DEVICE HAVING LIGHT-EMITTING ELEMENTS" by SAKAI et al.

According to the disclosure of WO 2004/023568A1, LEDs are two-dimensionally connected in series on an insulating substrate such as a sapphire substrate to form LED arrays. Two LED arrays are connected in reverse parallel on the sapphire substrate. As a result, there is provided a single chip light emitting device that can be driven by means of an AC power supply.

However, since the sapphire substrate has relatively lower thermal conductivity, heat cannot be smoothly dissipated. This limitation on the heat dissipation leads to a limitation on the maximum luminous power of the light emitting device. Therefore, there is a need to improve a heat dissipation property in order to increase the maximum luminous power of a light emitting device under a high voltage AC power source.

Further, since the LED arrays are alternately operated under the AC power source in the light emitting device, the luminous power is considerably limited as compared with a case where light emitting cells are simultaneously operated. As a result, in order to increase the maximum luminous power, it is necessary to improve the light extraction efficiency of each light emitting cell.

SUMMARY OF THE INVENTION

Accordingly, an object of the present invention is to provide a light emitting diode capable of being driven under an AC power source and having an improved heat dissipation property.

Another object of the present invention is to provide a light emitting diode with improved light extraction efficiency.

A further object of the present invention is to provide a method of fabricating a light emitting diode with an improved heat dissipation property and/or improved light extraction efficiency.

In order to achieve these objects, the present invention provides a light emitting diode having a thermal conductive substrate and a method of fabricating the same. A light emitting diode according to an aspect of the present invention includes a thermal conductive insulating substrate. A plurality of metal patterns are spaced apart from one another on the insulating substrate, and light emitting cells are located in regions on the respective metal patterns. Each of the light emitting cells includes a P-type semiconductor layer, an active layer and an N-type semiconductor layer. Meanwhile, metal wires electrically connect upper surfaces of the light emitting cells to adjacent metal patterns. Since the light emitting cells are operated on the thermal conductive substrate, a heat dissipation property of the light emitting diode can be improved.

Herein, the thermal conductive insulating substrate refers to an insulating substrate having thermal conductivity higher than that of a sapphire substrate. Further, the insulating substrate includes a semi-insulating substrate such as a semi-insulating SiC substrate. The term "semi-insulating" material means a high resistive material of which specific resistance is generally about 105 Ω·cm or more at the room temperature.

The active layer is interposed between the P-type semiconductor layer and the N-type semiconductor layer, and the positions of the P-type semiconductor layer and N-type semiconductor layer of the light emitting cell may be interchanged. Preferably, the P-type semiconductor layer of each of the light emitting cells is brought into contact with each of the metal patterns, and the surface of the N-type semiconductor layer of the light emitting cell defines an upper surface thereof. The surface of the N-type semiconductor layer may be roughened. As the surface of the N-type semiconductor layer is roughened, total internal reflection of light can be reduced, and thus light extraction efficiency of the light emitting diode can be increased.

Each of the metal patterns may include at least two metal layers that are bonded to each other. For example, the metal layers may include a reflective layer of a metal such as Ag and a thermal conductive layer of a metal such as Au, and may include an alloy of Au and Sn. The reflection metal layer causes light emitted from the light emitting cell to be reflected thereon toward the upper surface of the light emitting cell, thereby improving light output.

A method of fabricating a light emitting diode according to another aspect of the present invention comprises forming semiconductor layers including a buffer layer, an N-type semiconductor layer, an active layer and a P-type semiconductor layer on a first substrate, and a first metal layer on the semiconductor layers. Further, a second metal layer is formed on a second, thermal conductive insulating substrate separate from the first substrate. The first metal layer of the first substrate and the second metal layer of the second substrate are bonded such that the first and second metal layers face each other. Then, the first substrate is separated from the semiconductor layers, and the semiconductor layers and the metal layers are patterned to form metal patterns spaced apart from one another and light emitting cells located in regions on the respective metal patterns. Thereafter, metal wires are formed to connect upper surfaces of the light emitting cells to adjacent metal patterns. Accordingly, it is possible to fabricate a light emitting diode with a thermal conductive substrate, which has an improved heat dissipation property.

The active layer is interposed between the P-type semiconductor layer and the N-type semiconductor layer, and the positions of the P-type semiconductor layer and N-type semiconductor layer may be interchanged. Preferably, the P-type semiconductor layer is in ohmic contact with the first metal layer. In addition, the buffer layer may be removed to expose the N-type semiconductor layer after the first substrate has been separated.

The surface of the exposed N-type semiconductor layer may be roughened to improve light extraction efficiency.

For example, the roughening of the surface of the exposed N-type semiconductor layer may be performed using a photoelectrochemical (PEC) etching technique. Alternatively, the roughening of the surface of the exposed N-type semiconductor layer comprises forming a metal layer on the exposed N-type semiconductor layer. The metal layer is thermally treated to form metal islands, and the N-type semiconductor layer is partially etched using the metal islands as an etching mask. Accordingly, the N-type semiconductor layer with a roughened surface is formed.

Advantageous Effects

According to the present invention, it is possible to provide a light emitting diode capable of being driven under an AC power source and having an improved heat dissipation property. Further, it is possible to provide a light emitting diode with improved light extraction efficiency. In addition, it is possible to provide a method of fabricating a light emitting diode with an improved heat dissipation property and/or improved light extraction efficiency.

BRIEF DESCRIPTION OF THE DRAWINGS

FIG. 1 is a sectional view illustrating a light emitting diode according to an embodiment of the present invention.

FIGS. 2 to 6 are sectional views illustrating a method of fabricating the light emitting diode according the embodiment of the present invention.

FIGS. 7 to 10 are sectional views illustrating a method of fabricating a light emitting diode according to another embodiment of the present invention.

DETAILED DESCRIPTION OF THE ILLUSTRATED EMBODIMENTS

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

FIG. 1 is a sectional view illustrating a light emitting diode according to an embodiment of the present invention.

Referring to FIG. 1, a plurality of metal patterns 40 are spaced apart from one another on a thermal conductive insulating substrate 51. There is no limitation on the thermal conductive insulating substrate 51 so far as it has thermal conductivity larger than that of a sapphire substrate. The thermal conductive insulating substrate 51 may be a conductive single crystal substrate with an insulating layer formed on an upper surface thereof.

Each of the metal patterns 40 includes at least two bonded layers, e.g., a first metal layer 31a and a second metal layer 53a. Further, the first metal layer 31a may include a reflective metal layer and a thermal conductive metal layer. For example, the reflective metal layer may be made of Ag, and the thermal conductive metal layer may be made of Au or an alloy of Au and Sn. Further, the second metal layer may be made of, for example, Au or an alloy of Au and Sn.

A light emitting cell 30 is located in a region on each of the metal patterns. The light emitting cell 30 includes a P-type semiconductor layer 29a, an active layer 27a and an N-type semiconductor layer 25a. The active layer 27a is interposed between the P-type semiconductor layer 29a and the N-type semiconductor layer 25a. The positions of the P-type semiconductor layer 29a and N-type semiconductor layer 25a may be interchanged.

The N-type semiconductor layer 25a may be formed of N-type AlxInyGa1-x-yN (0.1toreq.x, y, x+y.ltoreq.1) and may include an N-type clad layer. Further, the P-type semiconductor layer 29a may be formed of P-type AlxInyGa1-x-yN (0.1toreq.x, y, x+y.ltoreq.1) and may include an P-type clad layer. The N-type semiconductor layer 25a may be formed through doping of Si, and the P-type semiconductor layer 29a may be formed through doping of Zn or Mg.

The active layer 27a is a region where electrons and holes are recombined, and includes InGaN. The wavelength of light emitted from the light emitting cell is determined depending on the kind of material constituting the active layer 27a. The active layer 27a may be a multi-layered film in which quantum well layers and barrier layers are repeatedly formed. The barrier layers and the quantum well layers may be binary to quaternary compound semiconductor layers that are expressed as a general formula of AlxInyGa1-x-yN (0.1toreq.x, y, x+y.ltoreq.1).

Generally, a buffer layer has been interposed between the substrate 51 and the light emitting cell 30. However, metal patterns 31 and 53 rather than a buffer layer are interposed therebetween in the embodiments of the present invention.

Meanwhile, metal wires 57 are used to electrically connect the N-type semiconductor layers 25a to adjacent metal patterns 40. To this end, an electrode pad 55 may be formed on each of the N-type semiconductor layers 25a. The electrode pad 55 is in ohmic contact with the N-type semiconductor layer 25a to lower their contact resistance. Accordingly, as shown in the figure, the metal wires 57 are used to connect the electrode pads 55 to the first metal layers 31a, thereby connecting the light emitting cells 30 to one another. The metal wires 57 form an array having the light emitting cells 30 connected in series. At least two arrays having light emitting cells connected in series may be formed on the substrate 51 and connected in reverse parallel to each other so as to be driven by an AC power source.

FIG. 10 is a sectional view illustrating a light emitting diode according to another embodiment of the present invention. In the figure, the same reference numbers as denoted in FIG. 1 designate the same components. Accordingly, only details different from those of the embodiment shown in FIG. 1 will be specifically described.

Referring to FIG. 10, an upper surface of an N-type semiconductor layer 65a according to this embodiment is roughened, which is different from the upper surface of the N-type semiconductor layer 25a shown in FIG. 1. Accordingly, a light emitting cell 70 has a roughened upper surface so that total internal reflection on the upper surface due to difference in refraction index can be reduced, thus light extraction efficiency of the light emitting cell can be increased.

The entire surface of the N-type semiconductor layer 65a may be formed as the roughened surface, and an electrode pad 75 may be formed on a portion of the roughened surface. Alternatively, the roughened surface may be selectively formed in another region except a certain region of the N-type semiconductor layer 65a, and the electrode pad 75 may be formed on the certain region. Metal wires 77 are used to connect the electrode pads 75 to the metal patterns 40 to form an array having light emitting cells connected in series.

According to this embodiment, the surface of the N-type semiconductor layer 25a may be roughened to improve the extraction efficiency of light emitted upwardly from the light emitting cell 70.

Hereinafter, a method of fabricating a light emitting diode according to each of the embodiments of the present invention will be described in detail.

FIGS. 2 to 6 are sectional views illustrating a method of fabricating the light emitting diode according to the first embodiment of the present invention.

Referring to FIG. 2, semiconductor layers including a buffer layer 23, an N-type semiconductor layer 25, an active layer 27 and a P-type semiconductor layer 29 are formed on a first substrate 21, and a first metal layer 31 is formed on the semiconductor layers.

The first substrate 21 is preferably formed of a substrate, such as a sapphire substrate, which allows light to be transmitted therethrough and is lattice-matched to the semiconductor layers.

The buffer layer 23 and the semiconductor layers 25, 27 and 29 may be formed by means of metal-organic chemical vapor deposition (MOCVD), molecular beam epitaxy (MBE), hydride vapor phase epitaxy (HVPE) or the like. Further, the semiconductor layers 25, 27 and 29 may be successively formed in the same processing chamber.

There is no particular limitation on the buffer layer 23 so far as the buffer layer can alleviate lattice mismatch between the first substrate 21 and the semiconductor layers 25, 27 and 29. For example, the buffer layer may be formed of undoped GaN.

The first metal layer 31 is made of a metal that is to be in ohmic contact with the P-type semiconductor layer. Further, the first metal layer 31 may include a reflective metal layer and a thermal conductive metal layer. The reflective metal layer is a metal layer with high reflectivity, and may be formed of, for example, Ag, but not specifically limited thereto. Moreover, the thermal conductive metal layer is a metal layer with high thermal conductivity. There is no specific limitation on the thermal conductive metal layer, and the thermal conductive metal layer may be made of Au or a laminate of Au and Sn.

A second metal layer 53 is formed on a second substrate 51 separate from the first substrate 21. The second substrate 51 is a thermal conductive insulating substrate that has thermal conductivity higher than that of a sapphire substrate.

The second metal layer 53 is intended to achieve metal bonding to the first metal layer 31. There is no specific limitation on the second metal layer, and the second metal layer may be made of Au or a laminate of Au and Sn.

Referring to FIG. 3, the first and second metal layers 31 and 53 are bonded such that they face each other. This bonding may be easily performed by applying certain pressure and/or heat.

Then, a laser is irradiated onto the first substrate 21. For example, the laser may be a KrF (248 nm) laser. Since the first substrate 21 is a transparent substrate such as a sapphire substrate, the laser passes through the first substrate 21 and is then absorbed by the buffer layer 23. Accordingly, the absorbed radiation energy causes the buffer layer 23 to be decomposed at an interface between the buffer layer 23 and the first substrate 21, so that the first substrate 21 may be separated from the semiconductor layers.

Referring to FIG. 4, after the separation of the first substrate 21, the remaining buffer layer 23 is removed so that the surface of the N-type semiconductor layer 25 can be exposed. The buffer layer 23 may be removed by means of an etching or polishing technique.

Referring to FIG. 5, the semiconductor layers 25, 27 and 29 and the metal layers 31 and 53 are patterned using photolithography and etching techniques so as to form metal patterns 40 spaced apart from one another and light emitting cells 30 located in regions on the respective metal patterns 40.

The light emitting cell 30 includes a P-type semiconductor layer 29a, an active layer 27a and an N-type semiconductor layer 25a, which have been formed by means of the patterning. These semiconductor layers 25a, 27a and 29a may be patterned in an identical shape.

Meanwhile, since the second substrate 51 is an insulating substrate, the formation of the metal patterns 40 spaced apart from one another enables the light emitting cells 30 to be electrically isolated from one another.

Referring to FIG. 6, metal wires 57 for electrically connecting upper surfaces of the light emitting cells 30 to adjacent metal patterns 40 are formed. The metal wires 57 connect the light emitting cells 30 to one another to form an array having the light emitting cells connected in series. At least two arrays may be formed, and these arrays may be connected to each other in reverse parallel so as to provide a light emitting diode that can be driven under an AC power source.

Meanwhile, an electrode pad 55 may be formed on the N-type semiconductor layer 25a before the metal wires are formed. The electrode pad 55 is in ohmic contact with the N-type semiconductor layer 25a. The metal wires 57 connect the electrode pads 55 to the metal patterns 40.

According to this embodiment, there is provided a light emitting diode which has light emitting cells on a thermal conductive substrate so that it can be driven under an AC power source and have an improved heat dissipation property. In the meantime, as the metal patterns 40 are formed, a process of forming an additional electrode pad on the P-type semiconductor layer 29a is omitted.

Meanwhile, in this embodiment of the present invention, the P-type semiconductor layer 29 and the N-type semiconductor layer 25 may be formed in reverse order. In this case, a transparent electrode may be formed on the P-type semiconductor layer 29 after the buffer layer 23 has been removed.

FIGS. 7 to 10 are sectional views illustrating a method of fabricating the light emitting diode according to the second embodiment of the present invention.

Referring to FIG. 7, the method of fabricating the light emitting diode according to this embodiment performs the same process as described with reference to FIGS. 2 to 4. Accordingly, at least two metal layers 31 and 53 are positioned in a bonded state on the second substrate 51, and the semiconductor layers including the P-type semiconductor layer 29, the active layer 27 and the N-type semiconductor layer 25 are positioned on the first metal layer 31. In this embodiment, the P-type semiconductor layer 29 is in ohmic contact with the first metal layer 31, and the surface of the N-type semiconductor layer 25 is exposed.

Referring to FIG. 8, the surface of the exposed N-type semiconductor layer 25 is roughened to form an N-type semiconductor layer 65 with a roughened surface. For example, the surface of the N-type semiconductor layer may be roughened by means of a photoelectrochemical (PEC) etching technique. The process of roughening the surface of the N-type semiconductor layer by means of the PEC etching technique is disclosed in a paper published on Feb. 9, 2004 and entitled "Increase in the Extraction Efficiency of GaN-based Light-Emitting Diodes via Surface Roughening" (Applied Physics Letters, Vol. 84, No. 6, pp 855-857). According to this paper, the surface of an N-type semiconductor layer can be roughened by means of the PEC etching technique using a KOH solution and a Xe lamp, resulting in improved light extraction efficiency.

Alternatively, the process of roughening the surface of the N-type semiconductor layer 25 may be performed using a dry etching technique. That is, a metal layer is formed on the N-type semiconductor layer 25. Then, heat is applied to the metal layer so that the metal layer can be formed into metal islands. Subsequently, the N-type semiconductor layer 25 is etched using the metal islands as an etching mask to form the N-type semiconductor layer 65 with a roughened surface. The remaining metal islands are removed using a wet etching technique or the like. Meanwhile, during this process, a flat portion may be formed in a certain region on the N-type semiconductor layer 25 by using a mask.

Referring to FIG. 9, as described with reference to FIG. 5, the semiconductor layers 65, 27 and 29 and the metal layers 31 and 53 are patterned using photolithography and etching techniques so as to form metal patterns 40 spaced apart from one another and light emitting cells 70 located in regions on the respective metal patterns 40.

Each of the light emitting cells 70 includes a P-type semiconductor layer 29a, an active layer 27a and an N-type semiconductor layer 65a, which have been formed by means of the patterning. These semiconductor layers 65a, 27a and 29a may be patterned in an identical shape.

Referring to FIG. 10, as described with reference to FIG. 6, metal wires 77 are formed to electrically connect upper surfaces of the light emitting cells 70 to adjacent metal patterns 40. Further, electrode pads 75 may be formed. Each of the electrode pads 75 may be formed in a flat region on the N-type semiconductor layer 65a. If a flat region is not formed on the N-type semiconductor layer 65a, the electrode pad 75 is formed on the roughened surface of the N-type semiconductor layer 65a.

According to this embodiment, the upper surface of the light emitting cell 70, i.e., the surface of the N-type semiconductor layer is roughened to provide a light emitting diode with improved light extraction efficiency.

What is claimed is:

1. A method of fabricating a light emitting diode, comprising:

forming semiconductor layers including a buffer layer, an N-type semiconductor layer, an active layer and a P-type semiconductor layer on a first substrate, and a first metal layer on the semiconductor layers;

forming a second metal layer on a second, thermal conductive insulating substrate;

bonding the first and second metal layers such that the metal layers face each other;

separating the first substrate from the semiconductor layers;

patterning the semiconductor layers and the metal layers to form metal patterns spaced apart from one another and light emitting cells located in regions on the respective metal patterns; and forming metal wires for connecting upper surfaces of the light emitting cells to adjacent metal patterns.

2. The method as claimed in claim 1, wherein the P-type semiconductor layer is in ohmic contact with the first metal layer.

3. The method as claimed in claim 1, further comprising removing the buffer layer to expose the N-type semiconductor layer after the separation of the first substrate.

4. The method as claimed in claim 3, further comprising roughening a surface of the exposed N-type semiconductor layer.

5. The method as claimed in claim 4, wherein roughening the surface of the exposed N-type semiconductor layer is performed using a PEC etching technique.

6. The method as claimed in claim 4, wherein roughening the surface of the exposed N-type semiconductor layer comprises:

forming a metal layer on the exposed N-type semiconductor layer; thermally treating the metal layer to form metal islands; and partially etching the N-type semiconductor layer by using the metal islands as an etching mask.

* * * * *